United States Patent
Lo

(10) Patent No.: US 7,986,147 B1
(45) Date of Patent: Jul. 26, 2011

(54) FAST CABLE TESTER

(75) Inventor: William Lo, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/897,813

(22) Filed: Oct. 5, 2010

Related U.S. Application Data

(63) Continuation of application No. 12/034,860, filed on Feb. 21, 2008, now Pat. No. 7,808,247.

(60) Provisional application No. 60/891,119, filed on Feb. 22, 2007.

(51) Int. Cl.
*G01R 31/11* (2006.01)
*G01R 31/02* (2006.01)

(52) U.S. Cl. ............................ 324/533; 324/534; 324/539

(58) Field of Classification Search .................. 324/533, 324/532, 527, 512, 500, 539, 523, 528, 534, 324/535, 66
See application file for complete search history.

(56) References Cited

U.S. PATENT DOCUMENTS

| | | | |
|---|---|---|---|
| 4,896,114 A * | 1/1990 | Donner | 324/522 |
| 4,914,394 A | 4/1990 | Meyer | |
| 5,420,512 A | 5/1995 | Spillane et al. | |
| 5,461,318 A | 10/1995 | Borchert et al. | |
| 5,559,427 A | 9/1996 | Hinds et al. | |
| 5,629,628 A | 5/1997 | Hinds et al. | |
| 6,138,080 A | 10/2000 | Richardson | |
| 6,177,801 B1 | 1/2001 | Chong | |
| 6,198,727 B1 | 3/2001 | Wakeley et al. | |
| 6,341,358 B1 | 1/2002 | Bagg et al. | |
| 6,377,640 B2 | 4/2002 | Trans | |
| 6,417,672 B1 | 7/2002 | Chong | |
| 6,434,716 B1 | 8/2002 | Johnson et al. | |
| 6,438,163 B1 | 8/2002 | Raghavan et al. | |
| 6,448,899 B1 | 9/2002 | Thompson | |
| 6,522,152 B1 | 2/2003 | Tonti et al. | |
| 6,535,983 B1 | 3/2003 | McCormack et al. | |
| 6,633,166 B1 | 10/2003 | Kaiser | |
| 6,694,017 B1 | 2/2004 | Takada | |
| 6,728,216 B1 | 4/2004 | Sterner | |
| 6,775,529 B1 | 8/2004 | Roo | |
| 6,777,952 B2 | 8/2004 | Seymour | |
| 6,825,672 B1 | 11/2004 | Lo | |

(Continued)

FOREIGN PATENT DOCUMENTS

| | | |
|---|---|---|
| WO | WO 01/11861 | 2/2001 |
| WO | WO 01/11861 A2 | 2/2001 |
| WO | WO 01/11861 A3 | 2/2001 |

OTHER PUBLICATIONS

U.S. Appl. No. 60/217,418, filed Jul. 2000, Lam.

(Continued)

*Primary Examiner* — Hoai-An D Nguyen

(57) ABSTRACT

A physical layer (PHY) device including a first transmitter, a first analog-to-digital converter (ADC) module, and a control module. The first transmitter is configured to transmit a first pulse on a first conductor of a first pair of conductors of a cable. The first ADC module is configured to generate a first set of outputs, in response to the transmission of the first pulse, by sampling an input from a second conductor of the first pair of conductors a plurality of times at a predetermined time interval. The control module is configured to determine a first distance from the PHY device to (i) an open-circuit, (ii) a short-circuit, or (iii) a termination of the first pair of conductors based on the first set of outputs.

20 Claims, 6 Drawing Sheets

U.S. PATENT DOCUMENTS

| | | | |
|---|---|---|---|
| 6,829,223 | B1 | 12/2004 | Richardson et al. |
| 6,873,827 | B1 | 3/2005 | Wright |
| 6,891,803 | B1 | 5/2005 | Chang et al. |
| 6,898,185 | B1 | 5/2005 | Agazzi et al. |
| 6,922,060 | B1 | 7/2005 | Wendel et al. |
| 6,924,651 | B2 * | 8/2005 | Osaka et al. ............... 324/628 |
| 6,940,289 | B2 | 9/2005 | Hyacinthe et al. |
| 6,977,507 | B1 | 12/2005 | Pannell et al. |
| 6,980,007 | B1 | 12/2005 | Lo et al. |
| 6,982,557 | B1 | 1/2006 | Lo et al. |
| 6,995,551 | B1 | 2/2006 | Lo et al. |
| 7,002,353 | B1 | 2/2006 | Lo et al. |
| 7,005,861 | B1 | 2/2006 | Lo et al. |
| 7,012,436 | B1 * | 3/2006 | Pannell et al. ............ 324/539 |
| 7,019,533 | B1 | 3/2006 | Lo et al. |
| 7,026,825 | B1 | 4/2006 | Lo et al. |
| 7,058,559 | B1 | 6/2006 | Roeck et al. |
| 7,068,043 | B1 | 6/2006 | Lo et al. |
| 7,068,044 | B1 | 6/2006 | Lo et al. |
| 7,075,283 | B1 | 7/2006 | Lo et al. |
| 7,127,481 | B1 | 10/2006 | Lam |
| 7,161,911 | B1 | 1/2007 | Fang et al. |
| 7,173,431 | B1 | 2/2007 | Lo et al. |
| 7,190,172 | B1 | 3/2007 | Lo et al. |
| 7,203,851 | B1 | 4/2007 | Lo et al. |
| 7,227,889 | B1 | 6/2007 | Roeck et al. |
| 7,246,368 | B1 | 7/2007 | Millet et al. |
| 7,250,771 | B1 | 7/2007 | Lo et al. |
| 7,276,913 | B1 | 10/2007 | Lo et al. |
| 7,358,745 | B1 | 4/2008 | Lo et al. |
| 7,375,532 | B1 | 5/2008 | Lo et al. |
| 7,403,018 | B1 | 7/2008 | Lo et al. |
| 7,495,450 | B2 * | 2/2009 | Furse et al. ............... 324/519 |
| 7,576,548 | B1 | 8/2009 | Lo et al. |
| 7,844,873 | B2 * | 11/2010 | Funatsu ..................... 714/741 |
| 2002/0046267 | A1 | 4/2002 | Andra et al. |
| 2002/0124110 | A1 | 9/2002 | Tanaka |
| 2003/0204611 | A1 | 10/2003 | McCosh et al. |
| 2007/0022331 | A1 | 1/2007 | Jamieson et al. |
| 2007/0230555 | A1 | 10/2007 | Peleg et al. |
| 2008/0265915 | A1 | 10/2008 | Clark et al. |

OTHER PUBLICATIONS

U.S. Appl. No. 09/991,043, filed Nov. 2001, Lo.

IEEE Std.802.3-2002 (Revision of IEEE Std 802.3®, 2000 Edition) IEEE Standard for Information technology—Telecommunications and information exchange between systems—Local and metropolitan area networks—Specific requirements—Part 3: Carrier sense multiple access with collision detection (CSMA/CD) access method and physical layer specifications; LAN/MAN Standards Committee of the IEEE Computer Society; Mar. 8, 2002; 578 pages.

IEEE Std 802.3-2002 (Revision of IEEE Std 802.3®, 2000 Edition) IEEE Standard for Information technology—Telecommunications and information exchange between systems—Local and metropolitan area networks—Specific requirements—Part 3: Carrier sense multiple access with Collision Detection (CSMA/CD) access method and physical layer specifications; Section Two: This section includes Clauses 21 through 22 and Annexes 22A through 32A; LAN/MAN Standards Committee of the IEEE Computer Society; Mar. 8, 2002; 582 pages.

IEEE Std 802.3-2002 (Revision of IEEE Std 802.3®, 2000 Edition) IEEE Standard for Information technology—Telecommunications and information exchange between systems—Local and metropolitan area networks—Specific requirements—Part 3: Carrier sense multiple access with collision detection (CSMA/CD) access method and physical layer specifications; Section Three: This section includes Clauses 34 through 43 and Annexes 36A through 43C; LAN/MAN Standards Committee of the IEEE Computer Society; Mar. 8, 2002; 379 pages.

Gunderson, M. et al., Bipolar Nanospeed Pulse Generation Using Transmission Lines for Cell Electro-Manipulation, Conference Record of International Power Modulator Symposium, 2004, May 23-26, 2004, p. 224-227.

Intel, "LXT9784 Octal 10/100 Transceiver Hardware Integrity Function Overview" Application Note, Jan. 2001, pp. 3-14.

IEEE std. 802.3 IEEE Standard for Information technology—Telecommunications and information exchange between systems—Local and metropolitan area networks—Specific requirements; Part 3: Carrier sense multiple access with collison detection (CSMA/DC) access method and physical layer specifications, Mar. 8, 2002, pp. 1-173.

IEEE Computer Society; IEEE Standard 802.3ab; IEEE Std 802.3-2002, IEEE Standard for Information technology—Telecommunications and information exchange between systems—Local and metropolitan area networks—Specific requirements; Part 3: Carrier sense multiple access with collision detection (CSMA/CD) access method and physical layer specifications, Mar. 8, 2002, pp. 174-249 and pp. 147-173.

* cited by examiner

FAST CABLE TESTER

CROSS-REFERENCE TO RELATED APPLICATIONS

This application is a continuation of U.S. Non-Provisional patent application Ser. No. 12/034,860, filed Feb. 21, 2008, which claims the benefit of U.S. Provisional Patent Application No. 60/891,119, filed Feb. 22, 2007, which are incorporated herein by reference in their entirety.

FIELD

The present disclosure relates to cable diagnostic systems, and more particularly to network cable-testers.

BACKGROUND

The background description provided herein is for the purpose of generally presenting the context of the disclosure. Work of the presently named inventors, to the extent the work is described in this background section, as well as aspects of the description which may not otherwise qualify as prior art at the time of filing, are neither expressly nor impliedly admitted as prior art against the present disclosure.

Referring now to FIG. 1, conventional cable testers 10 are frequently used to isolate cabling problems and to measure cable-lengths. The cable tester 10 is coupled to a cable 14 by a connector 12. The cable 14 can be a multi-conductor cable, and the connector 12 may comprise an RJ-45 or other suitable connector. A connector 15 connects the cable 14 to a load 16. The cable tester 10 typically uses a loop-back module (not shown) as the load 16 at a remote end. The cable tester 10 performs cable analysis—e.g., detects a short, an open, a crossed pair, or a reversed pair—in the cable 14. A short or an open in the cable 14 may be detected without a load. The cable tester 10 can also determine a length of the cable 14 and a distance from one end of the cable 14 to a point where the cable 14 has a fault such as a short or an open condition.

For example, in a multi-conductor cable, a short condition occurs when two or more conductors in the cable 14 are short-circuited together. An open condition occurs when one or more conductors in the cable 14 lack continuity between both ends of the cable 14. A crossed pair occurs when a pair of conductors communicates with different pins at each end of the cable 14. For example, a first pair of conductors may communicate with pins 1 and 2 at one end and pins 3 and 6 at the other end. A reversed pair occurs when two ends in a pair are connected to opposite pins at each end of the cable 14. For example, a conductor connected to pin 1 on one end communicates with pin 2 at the other end, and a conductor connected to pin 2 on one end communicates with pin 1 at the other end.

The cable tester 10 typically employs time domain reflectometry (TDR) (which is based on transmission line theory) to troubleshoot cable faults and to measure cable-lengths. In operation, the cable tester 10 transmits a test pulse 17 on the cable 14 and analyzes a corresponding reflection or a return pulse 18. Specifically, the cable tester 10 measures a difference between a time when the test pulse 17 is transmitted and a time when the return pulse 18 is received. Additionally, the cable tester 10 analyzes characteristics such as shape and size of the return pulse 18 relative to the test pulse 17. Thus, a fault in the cable 14, as well as a length of the cable 14, can be determined based on electrical properties of the cable 14 (e.g., a cable propagation constant) and comparisons between a test pulse 17 and a corresponding return pulse 18.

A conventional cable tester (e.g., cable tester 10), however, may generate inaccurate results when a cable is properly terminated at the remote end. For example, TDR techniques typically cannot be used to determine a length of a cable when the cable is connected (at the remote end) to a link partner that is active or in use. In such a case, the cable functions as a substantially balanced transmission line when the remote end of the cable is properly terminated. With a substantially balanced transmission line, when the remote end receives a TDR pulse (e.g., test pulse 17), the remote end may return a very weak signal. Weak return signals typically cannot be analyzed unless extensive electronic circuits are used. Implementing extensive electronic circuits, however, can be expensive and may not be feasible in low-cost systems.

Alternatively, digital signal processing (DSP) techniques can be used to determine a length of a cable when the cable is connected to an active link. In DSP, unlike in TDR, no pulses are injected into a cable. Instead, parameters such as amplitude, pulse width, pulse shape, etc., of signals that are normally transmitted and received on the cable are measured to determine a length of the cable (or cable-length). DSP, however, involves making some assumptions and therefore yields cable-length measurements that are approximate rather than accurate.

For example, if the length of a cable is determined based on amplitude of a received signal, the amplitude of the transmitted signal is generally unknown or unknowable and, therefore, needs to be assumed. Additionally, any attenuation in the received signal is calculated by assuming an average attenuation per unit length of the cable. Therefore, the length of a cable determined using DSP techniques is generally an approximate estimate rather than an accurate measurement.

Thus, in low-cost systems, since TDR techniques generally cannot be used to analyze reflections from a properly terminated end or an active link, TDR techniques cannot be used to determine a cable-length although the cable may have no faults. Furthermore, although DSP can determine the length of the cable that is properly terminated or that is connected to an active remote end, DSP cannot determine the cable-length accurately when the cable is very long.

SUMMARY

A physical layer (PHY) device of a network device comprises a signal generator module that generates a first test signal and that transmits the first test signal on a first conductor of a first pair of a cable at time T1. An analog-to-digital converter (ADC) module has an input that communicates with a second conductor of the cable and an output that generates first S outputs at times (T1+(S*t)), where S is greater than 1, and t>0. A control module determines a distance from the PHY to one of an open-circuit and short-circuit of the first pair based on the first S outputs.

In other features, a buffer stores the first S outputs. The second conductor receives a first return pulse after the time T1 when the first pair is one of open and short-circuited. The signal generator module generates a second test signal and transmits the second test signal on the first conductor at time T2. The ADC module generates second S outputs at times (T2+(S*t)), where T2>(T1+(S*t)). The second conductor receives a second return pulse after the time T2 when the first pair is one of open and short-circuited. The control module compares the first S outputs to the second S outputs, generates S differences between the first and second S outputs, and stores the second S outputs in the buffer.

In other features, an accumulator accumulates the second S outputs when the S differences are less than or equal to a predetermined threshold. The predetermined threshold is based on an amount of noise present on the cable. Based on the second S outputs in the accumulator, the control module determines a distance from the PHY to a point where the first pair is one of open and short-circuited. The control module determines the distance using time domain reflectometry (TDR).

A method for operating a physical layer (PHY) device of a network device comprises generating a first test signal and transmitting the first test signal on a first conductor of a first pair of a cable at time T1; providing an input that communicates with a second conductor of the cable and an output that generates first S outputs at times (T1+(S*t)), where S is greater than 1, and t>0; and determining a distance from the PHY to one of an open-circuit and short-circuit of the first pair based on the first S outputs.

In other features, the method includes storing the first S outputs in a buffer. The method includes receiving a first return pulse on the second conductor after the time T1 when the first pair is one of open and short-circuited. The method includes generating a second test signal; and transmitting the second test signal on the first conductor at time T2. The method includes generating second S outputs at times (T2+(S*t)), where T2>(T1+(S*t)).

In other features, the method includes receiving a second return pulse on the second conductor after the time T2 when the first pair is one of open and short-circuited. The method includes comparing the first S outputs to the second S outputs; generating S differences between the first and second S outputs; and storing the second S outputs in the buffer.

In other features, the method includes accumulating the second S outputs when the S differences are less than or equal to a predetermined threshold. The method includes basing the predetermined threshold on an amount of noise present on the cable. In other features, the method includes determining a distance from the PHY to a point where the first pair is one of open and short-circuited based on the accumulated second S outputs. The method includes determining the distance using time domain reflectometry (TDR).

A computer program stored on a computer readable medium for operating a physical layer (PHY) device of a network device comprises generating a first test signal and transmitting the first test signal on a first conductor of a first pair of a cable at time T1; providing an input that communicates with a second conductor of the cable and an output that generates first S outputs at times (T1+(S*t)), where S is greater than 1, and t>0; and determining a distance from the PHY to one of an open-circuit and short-circuit of the first pair based on the first S outputs.

In other features, the computer program includes storing the first S outputs in a buffer. The computer program includes receiving a first return pulse on the second conductor after the time T1 when the first pair is one of open and short-circuited. The computer program includes generating a second test signal; and transmitting the second test signal on the first conductor at time T2. The computer program generates second S outputs at times (T2+(S*t)), where T2>(T1+(S*t)).

In other features, the computer program includes receiving a second return pulse on the second conductor after the time T2 when the first pair is one of open and short-circuited. The computer program includes comparing the first S outputs to the second S outputs; generating S differences between the first and second S outputs; and storing the second S outputs in the buffer.

In other features, the computer program includes accumulating the second S outputs when the S differences are less than or equal to a predetermined threshold. The computer program includes basing the predetermined threshold on an amount of noise present on the cable. In other features, the computer program includes determining a distance from the PHY to a point where the first pair is one of open and short-circuited based on the accumulated second S outputs. The computer program includes determining the distance using time domain reflectometry (TDR).

A physical layer (PHY) device of a network device comprises signal generating means for generating a first test signal and for transmitting the first test signal on a first conductor of a first pair of a cable at time T1. Analog-to-digital converting (ADC) means communicates with a second conductor of the cable and generates first S outputs at times (T1+(S*t)), where S is greater than 1, and t>0. Control means determines a distance from the PHY to one of an open-circuit and short-circuit of the first pair based on the first S outputs.

In other features, buffer means stores the first S outputs. The second conductor receives a first return pulse after the time T1 when the first pair is one of open and short-circuited. The signal generating means generates a second test signal and transmits the second test signal on the first conductor at time T2, and wherein the ADC means generates second S outputs at times (T2+(S*t)), where T2>(T1+(S*t)). The second conductor receives a second return pulse after the time T2 when the first pair is one of open and short-circuited. The control means compares the first S outputs to the second S outputs, generates S differences between the first and second S outputs, and stores the second S outputs in the buffer.

In other features, accumulating means accumulates the second S outputs when the S differences are less than or equal to a predetermined threshold. The predetermined threshold is based on an amount of noise present on the cable. Based on the second S outputs in the accumulating means, the control means determines a distance from the PHY to a point where the first pair is one of open and short-circuited. The control means determines the distance using time domain reflectometry (TDR).

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
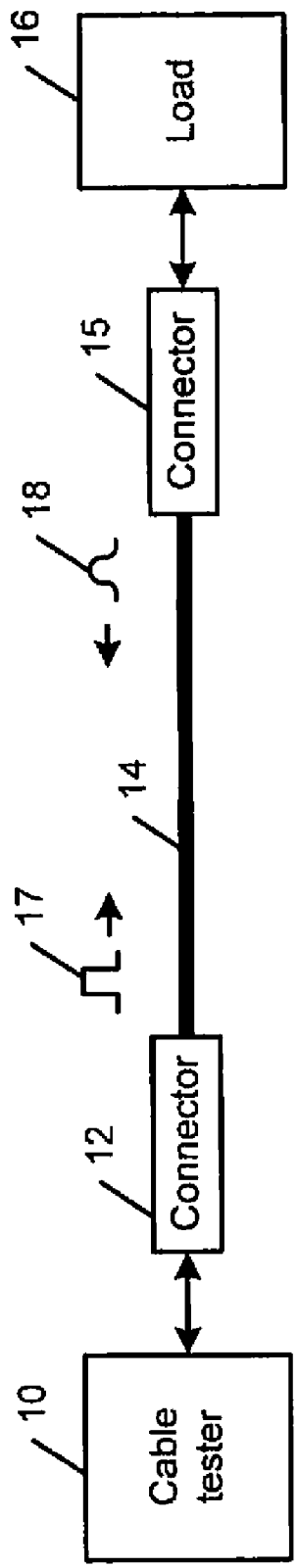
FIG. 1 is a functional block diagram of a conventional cable tester.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

A network device generally comprises a physical layer module (PHY) and a medium access controller (MAC). In wired networks, the PHY connects the network device to a cable, and the MAC provides an interface between the PHY and a host (e.g., a computer or other device). The network device can be any type of device that can be connected to a network—e.g., a printer, a router, a computer, a hand-held device, a Voice-over Internet Protocol (VoIP) player, a set top box, a hard disk drive, and the like.

Figure 2:
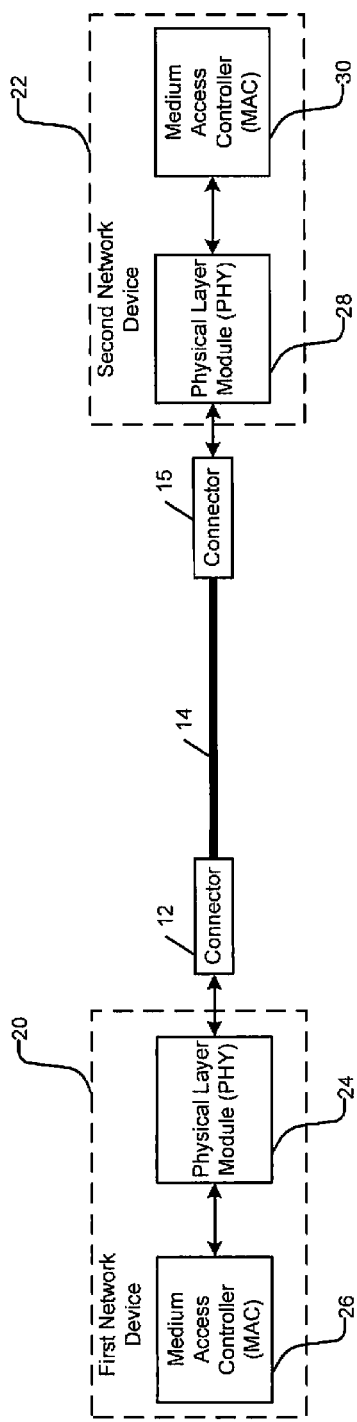
FIG. 2 is a functional block diagram of an exemplary network comprising a first network device communicating with a second network device via a twisted-pair cable.

Referring now to FIG. 2, a first network device 20 and a second network device 22 is connected by the cable 14. The first network device 20 comprises a PHY 24 and a MAC 26. The PHY 24 is coupled to the cable 14 via a connector 12. The second network device 22 comprises a PHY 28 and a MAC 30. The PHY 28 is coupled to the cable 14 via a connector 15. The PHY 24 may communicate with the PHY 28 via the cable 14. Generally, the first network device 20 may be called a local device, and the second network device 22 may be called a link partner of the local device, or vice versa.

Figure 3:
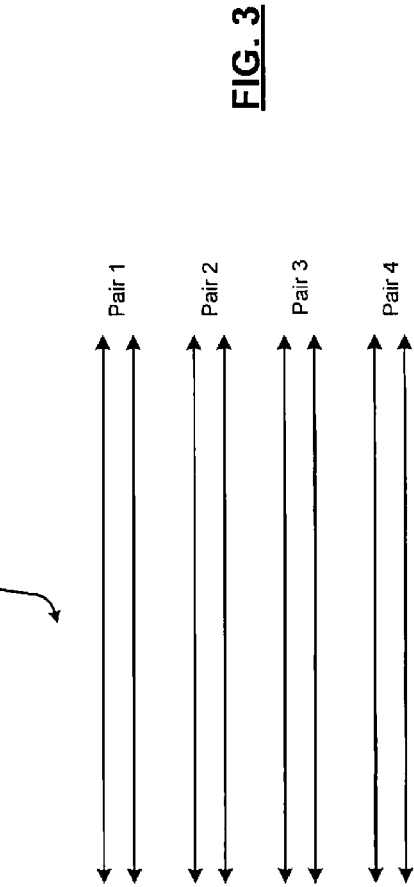
FIG. 3 depicts components of the twisted-pair cable of FIG. 2.

In an Ethernet-based network, the cable 14 may include a CAT5 or CAT6 twisted-pair cable having eight conductors. The eight conductors may be grouped into four pairs of twisted wire as shown in FIG. 3 (twists not shown). The connectors 12 and 15 are generally RJ45 connectors. Although the present disclosure refers to CAT5 and CAT6 cables and RJ45 connectors, the systems and methods disclosed herein may be applicable to cables of other categories (e.g., CAT3, CAT7, and the like), cables having more than four pairs of conductors, and other types of connectors (e.g., RJ11, RJ48, RJ49, RJ61, and so on).

Cable-lengths can be accurately determined by using cable testers that are built into the PHYs. In one implementation, the built-in cable testers use time domain reflectometry (TDR) to measure cable-lengths and diagnose cable problems. Unlike conventional cable testers, the built-in cable testers can accurately measure lengths of cables that are properly terminated (e.g., connected to a PHY at either end). Additionally, the built-in cable testers may be selectively activated to measure cable-lengths and diagnose cable problems.

Specifically, (in one implementation) the built-in cable testers test cables and measure cable-lengths by performing TDR pair-by-pair on all pairs of the cable. The built-in cable testers may transmit multiple test pulses over each pair of the cable. For each transmitted pulse, the built-in cable tester may receive a corresponding reflection or a return pulse from the remote end of the cable or from a point of fault along the length of the cable. The reflections may be averaged. The built-in cable testers analyze the return pulses and determine cable status such as an open, a short, or no fault, etc. Additionally, the built-in cable testers determine a distance from the PHY to a point of fault along the length of the cable and the distance from the PHY to the remote end of the cable (i.e., the length of the cable).

Figure 4:
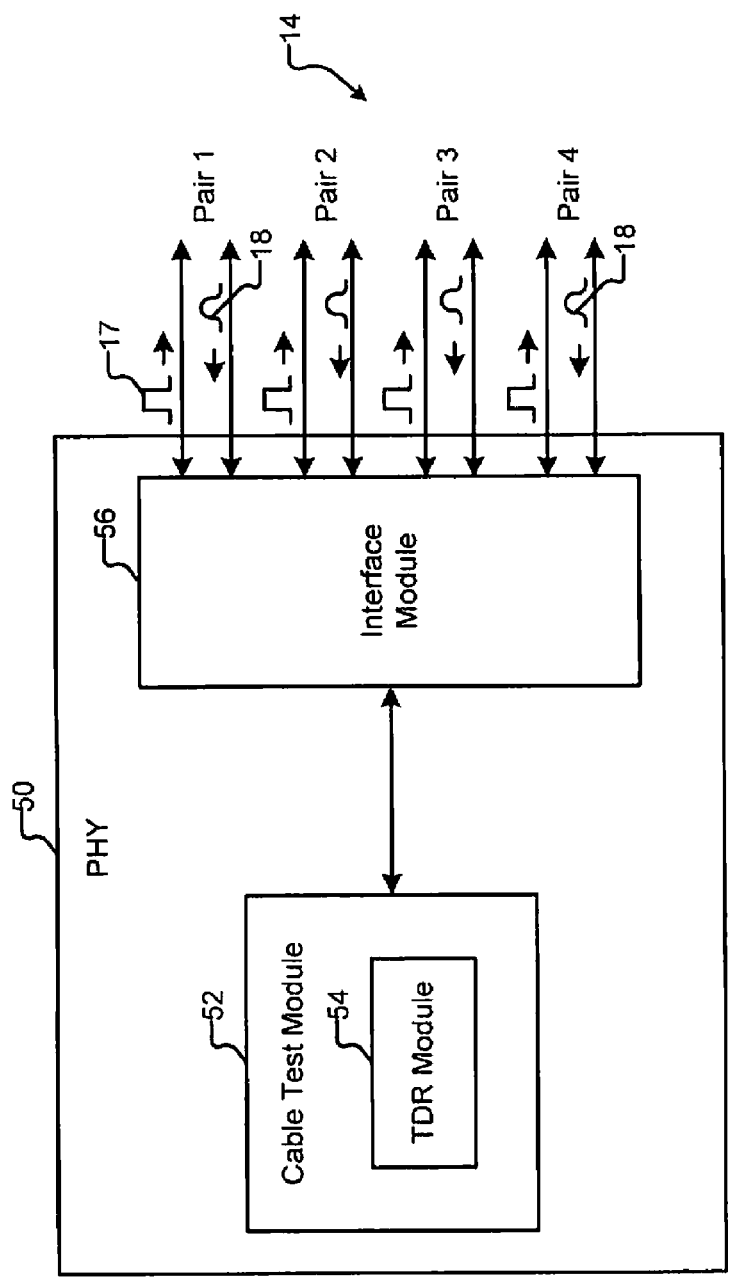
FIG. 4 is a functional block diagram of an exemplary physical layer module (PHY) of a network device comprising a cable tester.

Referring now to FIG. 4, a PHY 50 comprising a cable test module 52 for testing the cable 14 is shown. The cable test module 52 may include a TDR module 54. The PHY 50 may interface with the cable 14 via an interface module 56. When testing the cable 14, the TDR module 54 may communicate with the cable 14 via the interface module 56. The cable 14 may comprise four pairs of twisted wires (e.g., pair 1, pair 2, pair 3, and pair 4). Connectors and twists of the cable 14 are omitted for simplicity.

A network device (not shown) comprising the PHY 50 may communicate with a link partner (not shown) via the cable 14. The cable 14 may connect the PHY 50 to a remote PHY (not shown) of the link partner. The remote PHY may be able to selectively short-circuit the pairs of the cable 14 at the remote PHY when the PHY 50 tests respective pairs of the cable 14.

The cable test module 52 may test the cable 14 by performing TDR pair-by-pair on the four pairs. The TDR module 54 may transmit test pulses 17 on the four pairs, one pair at a time. The TDR module 54 may receive return pulses 18 on the respective pairs when the cable 14 is open or short-circuited at a remote end. The short circuit may be a fault condition or may be generated by the remote PHY. The TDR module 54 may process the return pulses 18 and determine the status of the cable 14 including, e.g., whether the cable 14 is open, short-circuited, or properly terminated at the remote PHY. Additionally, the TDR module 54 may determine a distance from the PHY 50 to a point where the cable 14 may be open, short-circuited, or properly terminated.

In some implementations, the TDR module 54 may transmit a plurality of test pulses 17 (e.g., 256 pulses) on a first wire of a pair and may measure amplitudes of return pulses 18 that may be received on a second wire of the pair. The TDR module 54 may average the amplitudes to diagnose the cable status more accurately when noise is present. As an example, for a given length of the cable 14, a time difference between transmitting a test pulse 17 and receiving a corresponding return pulse 18 may be 3 us when the cable 14 has no fault. The TDR module 54 may transmit 256 test pulses 17 on the first wire of the first pair at times T, T+3 us, T+6 us, . . . , and T+(256*3 us). The TDR module 54 may measure amplitudes of 256 return pulses 18 on the second wire of the first pair at time T+t, where t is negligibly smaller than 3 us (e.g., t=8 ns). The TDR module 54 may average the 256 amplitude measurements and generate a first average amplitude.

Subsequently, the TDR module 54 may again transmit 256 test pulses 17 at times T, T+3 us, T+6 us, . . . , and T+(256*3 us) on the first wire. The TDR module 54 may measure amplitudes of 256 return pulses 18 on the second wire at time T+2 t. The TDR module 54 may average the 256 amplitude measurements and generate a second average amplitude. Similarly, the TDR module 54 may again transmit 256 test pulses 17 at times T, T+3 us, T+6 us, . . . , and T+(256*3 us). The TDR module 54 may measure amplitudes of 256 return pulses 18 at time T+S*t, where S is an integer greater than or equal to 1 (e.g., S=2048). The TDR module 54 may average the 256 amplitude measurements and generate an $S^{th}$ (e.g., $2048^{th}$) average amplitude.

Based on the S average amplitudes measured at times T+t, T+2 t, . . . , and T+S*t, the TDR module 54 may accurately determine a distance from the PHY 50 to a point on the first pair of cable 14 from where the return pulses 18 reflected. Accordingly, the TDR module 54 may accurately determine the distance to a short, an open, or a proper termination of the first pair (i.e., the length of the cable 14). The TDR module 54 may take 2048*256*3 us (i.e., approximately 1.6 seconds) to diagnose the first pair. When the TDR module 54 performs TDR on all four pairs, the total time to diagnose the cable 14 may be 4*2048*256*3 us (i.e., greater than 6 seconds).

Figure 5:
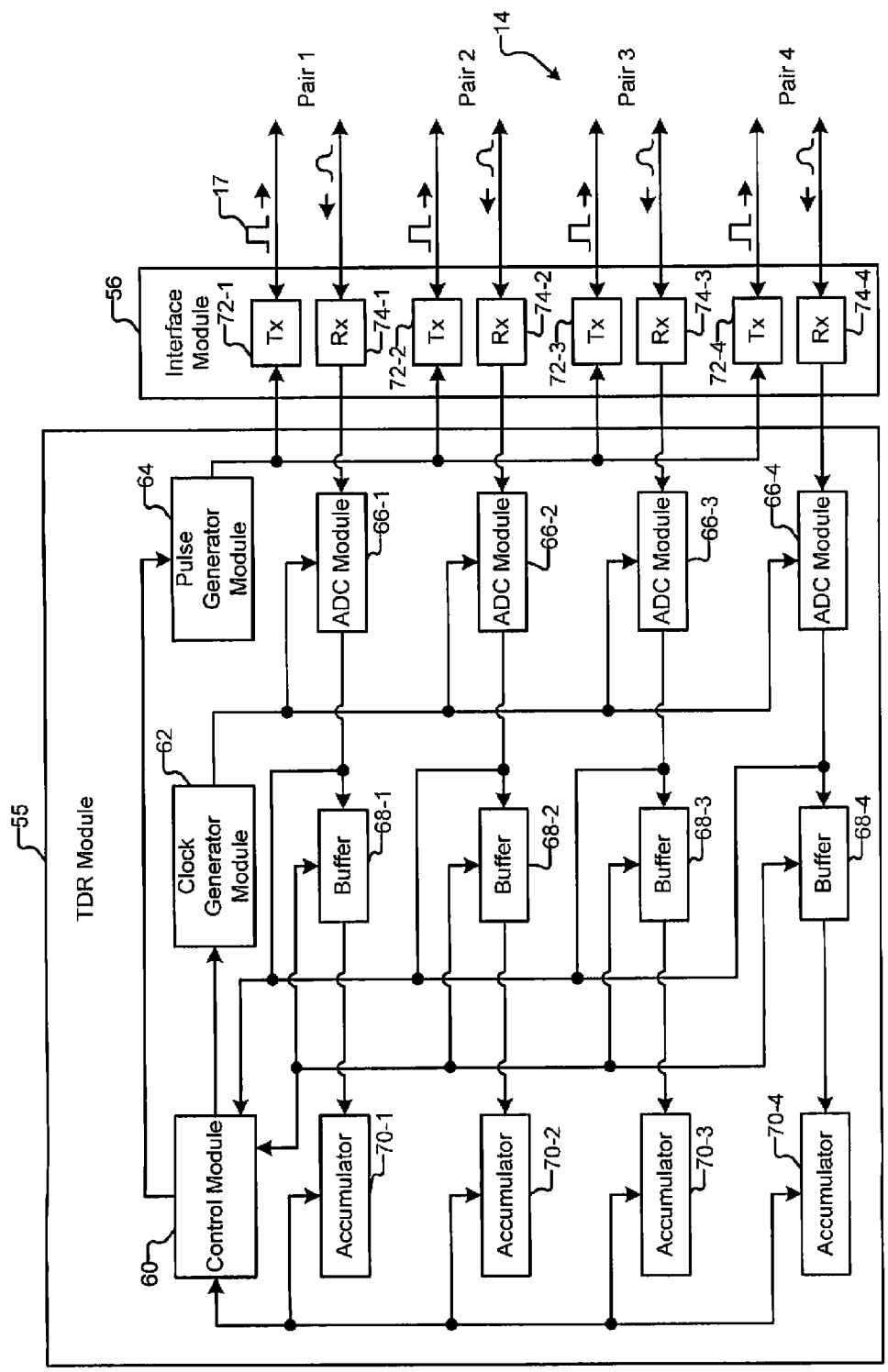
FIG. 5 is a functional block diagram of an exemplary cable tester.

Referring now to FIG. 5, the time to diagnose the cable 14 may be decreased as follows. A TDR module 55 may transmit a first test pulse 17 at time T on the first wire of the first pair. The TDR module 55 may measure amplitudes at the second wire of the first pair at times T+t, T+2 t, . . . , and T+(2048*t). The times T+t, T+2 t, . . . , and T+(2048*t) may be called sample points. The TDR module 55 may store the first 2048 amplitudes (referred to herein also as samples) in memory. After approximately 3 us, the TDR module 55 may transmit a second test pulse 17 and measure amplitudes at the second wire at times T'+t, T'+2 t, . . . , and T'+(2048*t), where T'=T+3 us. The TDR module 55 may accumulate the second 2048 amplitudes if a difference between each of the second 2048 amplitudes and the corresponding first 2048 amplitudes is within a predetermined threshold.

Thus, the TDR module 55 may measure and accumulate 2048 amplitudes for 256 test pulses 17 and generate 256 samples. Since the 256 test pulses 17 are transmitted on the first pair in a total of 256*3 us (i.e., less than 0.8 milliseconds), the TDR module 55 may take 256*3 us to generate 256 samples. The TDR module 55 may complete TDR on all four pairs in 4*256*3 us (i.e., approximately 3 milliseconds). Additionally, since the TDR module 55 captures and stores amplitude data in memory, the TDR module 55 may process the amplitude data and may diagnose the cable 14 thoroughly while a PHY (not shown) comprising the TDR module 55 begins normal operation.

Specifically, the TDR module 55 may comprise a control module 60, a pulse generator module 62, and a clock generator module 64. Additionally, the TDR module 55 may comprise analog-to-digital converter (ADC) modules 66-1, 66-2, 66-3, and 66-4 (collectively ADC modules 66), buffers 68-1, 68-2, 68-3, and 68-4 (collectively buffers 68), and accumulators 70-1, 70-2, 70-3, and 70-4 (collectively accumulators 70). The interface module 56 may comprise transmitters (Tx) 72-1, 72-2, 72-3, and 72-4 (collectively transmitters 74), and receivers (Rx) 74-1, 74-2, 74-3, and 74-4 (collectively receivers 74). First, a summary of the operation of the TDR module 55 is presented.

When the TDR module 55 tests the cable 14 (e.g., in test mode), the control module 60 generates control signals that control the pulse generator module 62, the clock generator module 64, the buffers 68, and the accumulators 70. The pulse generator module 62 generator generates the test pulses 17. The transmitters 72 transmit the test pulses 17 on the first wires of the four pairs, one pair at a time. The transmitters 72 transmit the test pulses 17 one pulse at a time. The receivers 74 may receive return pulses 18 on the second wires of the respective pairs. The ADC modules 66 generate measurements of the amplitudes based on inputs received from the second wires. The clock generator module 64 generates a clock of period t (typically in nanoseconds (ns)) that clocks the ADC modules 66 when the transmitters 72 transmit one test pulse 17. The ADC modules 66 generate a plurality of amplitude measurements every t ns before a next test pulse 17 is transmitted. The plurality of amplitude measurements represents one sample. The amplitude measurements of a sample are buffered in the buffers 68.

Subsequently, the pulse generator module 62 generates the next pulse. The ADC modules 66 generate a first amplitude measurement at time t after the next pulse is transmitted. The control module 60 compares the first amplitude measurement to the first amplitude measurement from the previous sample stored in the buffers 68 and determines if the difference between the two is greater than or equal to a predetermined threshold. If noise is present, the difference may be greater than or equal to the predetermined threshold. When none of the amplitude measurements indicates presence of noise, the sample is called a good sample, and the amplitude measurements stored in the buffers 68 are accumulated in the respective accumulators 70. When any of the amplitude measurements indicates presence of noise, the sample is called a bad sample, and the amplitude measurements stored in the buffers 68 are not accumulated in the respective accumulators 70.

After a predetermined number of test pulses 17 are transmitted on one pair, the control module 60 may repeat the procedure on other pairs. Subsequently, the control module 60 may enter normal mode wherein the pulse generator module 62 does not generate test pulses 17, and the PHY begins normal operation. The control module 60 may analyze the amplitude measurements from samples stored in the accumulators 70 and indicate status of each pair and of the cable 14 in detail (e.g., open, short, proper termination, respective distances, etc.).

More specifically, when the TDR module 55 begins testing the cable 14, the control module 60 sets a sample count C1=1 and a bad sample count C2=0 for the first pair. Since data generated during each test pulse 17 represents one sample, the sample count C1 may represent the number of test pulses 17 transmitted on the first pair. The bad sample count C2 indicates the number samples in which presence of noise is detected. The control module 60 generates a first control signal and inputs the first control signal to the pulse generator module 62, the clock generator module 64, and the accumulator 70-1. The first control signal initializes the accumulator 70-1 (e.g., loads all 0s in the accumulator 70-1). The pulse generator module 62 generates the first test pulse 17 and outputs the first test pulse 17 to the transmitter 72-1. The transmitter 72-1 transmits the first test pulse 17 on the first wire of the first pair at time T.

The clock generator module 64 generates the clock of period t that clocks the ADC module 64-1. The clock may increment a sample point count C3 (initially reset by the control module 60) at every t ns. The clock latches the output of the ADC module 64-1 at every t ns after time T. The ADC module 64-1 receives input from the second wire of the first pair. Depending on the length of the cable 14, the status of the cable (e.g., short, open, properly terminated, etc.), and the time elapsed after time T, the input may or may not include a return pulse 18. Based on the input, the ADC module 64-1 generates an output every t ns. Each output is an amplitude measurement of the input and is stored in a respective memory location in the buffer 68-1. For example, the ADC module 64-1 may generate 2048 amplitude measurements at times T+t, T+2 t, . . . , and T+(2048*t) called sample points. The 2048 amplitude measurements are called a first sample and are stored in memory locations 1, 2, . . . , 2048 of the buffer 68-1, respectively.

Approximately 3 us after transmitting the first test pulse 17, the pulse generator module 62 generates a second test pulse 17 and inputs the second test pulse 17 to the transmitter 72-1. The transmitter 72-1 transmits the second test pulse 17 on the first wire of the first pair at time T', where T'=T+3 us. The control module 60 resets sample point count C3. The clock latches the output of the ADC module 64-1 at every t ns after time T'. Based on the input, the ADC module 64-1 generates an output every t ns. The ADC module 64-1 may generate 2048 amplitude measurements at sample points T'+t, T'+2 t, . . . , and T'+(2048*t). The 2048 amplitude measurements are called a second sample and are stored as follows in memory locations 1, 2, . . . , 2048 of the buffer 68-1, respectively.

When the ADC module 64-1 generates the first amplitude measurement of the second sample, the control module 60 compares the first amplitude measurement to the first amplitude measurement of the first sample stored in the first memory location of the buffer 68-1. If the difference between the two is greater than or equal to the predetermined threshold, the control module 60 increments a failure count C4. The failure count C4 indicates the number of times the amplitude measurements in a current sample differ from corresponding amplitude measurements of a previous sample by more than the predetermined threshold. At the end of the second sample, if the failure count C4 is non-zero, the second sample is considered a bad sample, the control module 60 increments the bad sample count C2, and the data from the second sample stored in the buffer 68-1 is not accumulated in the accumulator 70-1. On the other hand, at the end of the second sample, if the failure count C4 is zero, the second sample is considered a good sample, and the data from the second sample stored in the buffer 68-1 is accumulated in the accumulator 70-1. At the end of each sample, the control module 60 resets the failure count C4.

The control module 60 may set a bad sample limit (or a bad sample threshold) on the bad sample count C2. Before taking a next sample, the control module 60 may determine if the bad sample count C2 is greater than or equal to the bad sample limit. When the bad sample count C2 exceeds the bad sample limit, the control module 60 may infer that the noise level is high, and the control module 60 may stop testing the cable 14. When the bad sample count C2 is less than the limit, the control module 60 may complete testing the first pair by transmitting a predetermined number of test pulses 17 (e.g., 256 test pulses 17). Depending on the number of bad samples detected, the accumulator 70-1 may have 256 or less samples.

The control module 60 may determine the status of the cable 14 by averaging the data of the samples in the accumulator 70-1. Alternatively, the control module 60 may determine the status of the cable 14 after the TDR module 55 tests other pairs. Thereafter, the control module 60 may generate a second control signal that is input to the pulse generator module 62. The pulse generator may stop generating the test pulses 17. The PHY may begin normal operation. Subsequently, the control module 60 may analyze the data of the samples stored in accumulators 70 and generate detailed status information of the cable 14.

Figure 6A:
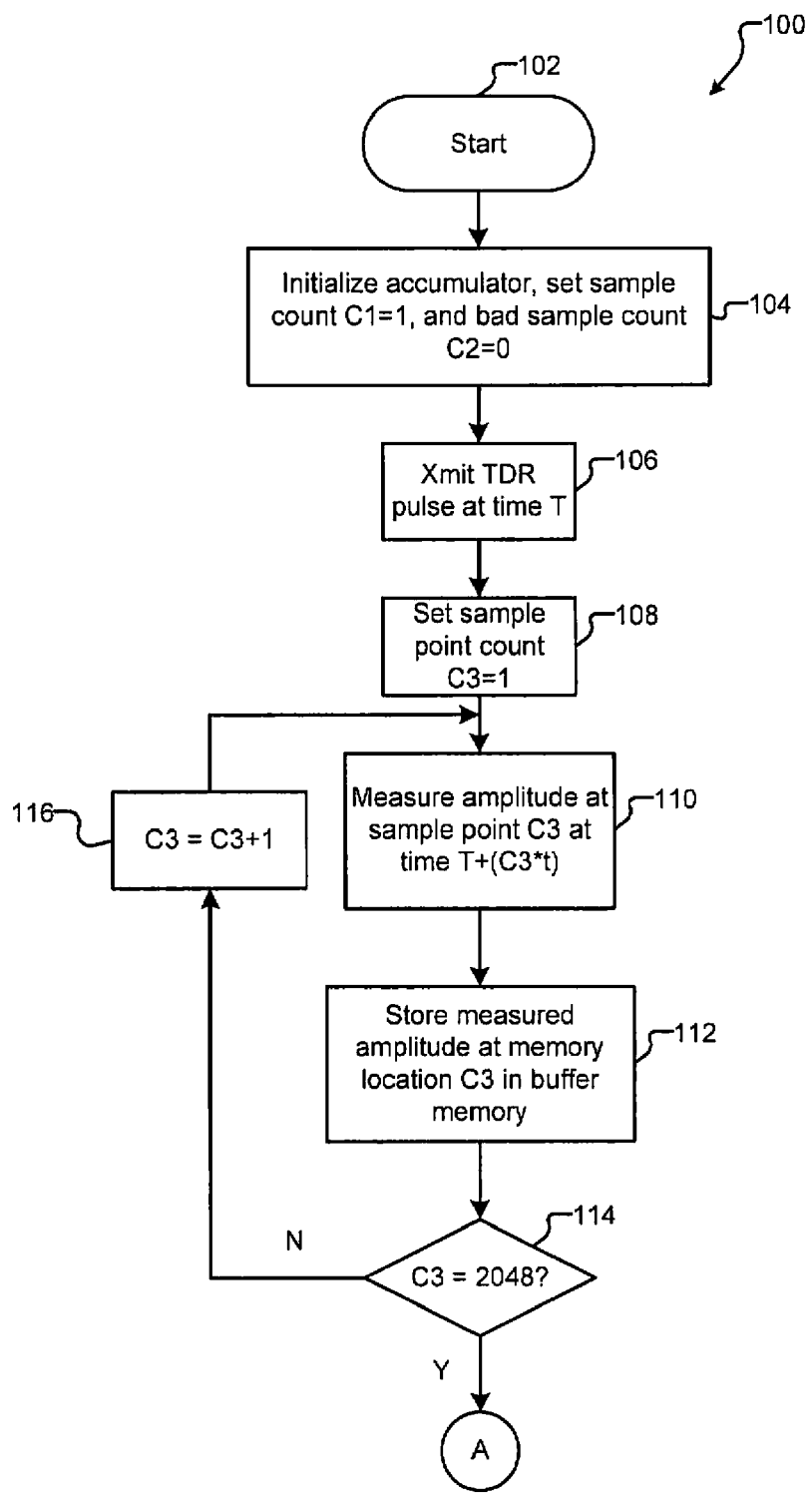
FIGS. 6A and 6B depict a flowchart of an exemplary method for testing cables.
Figure 6B:
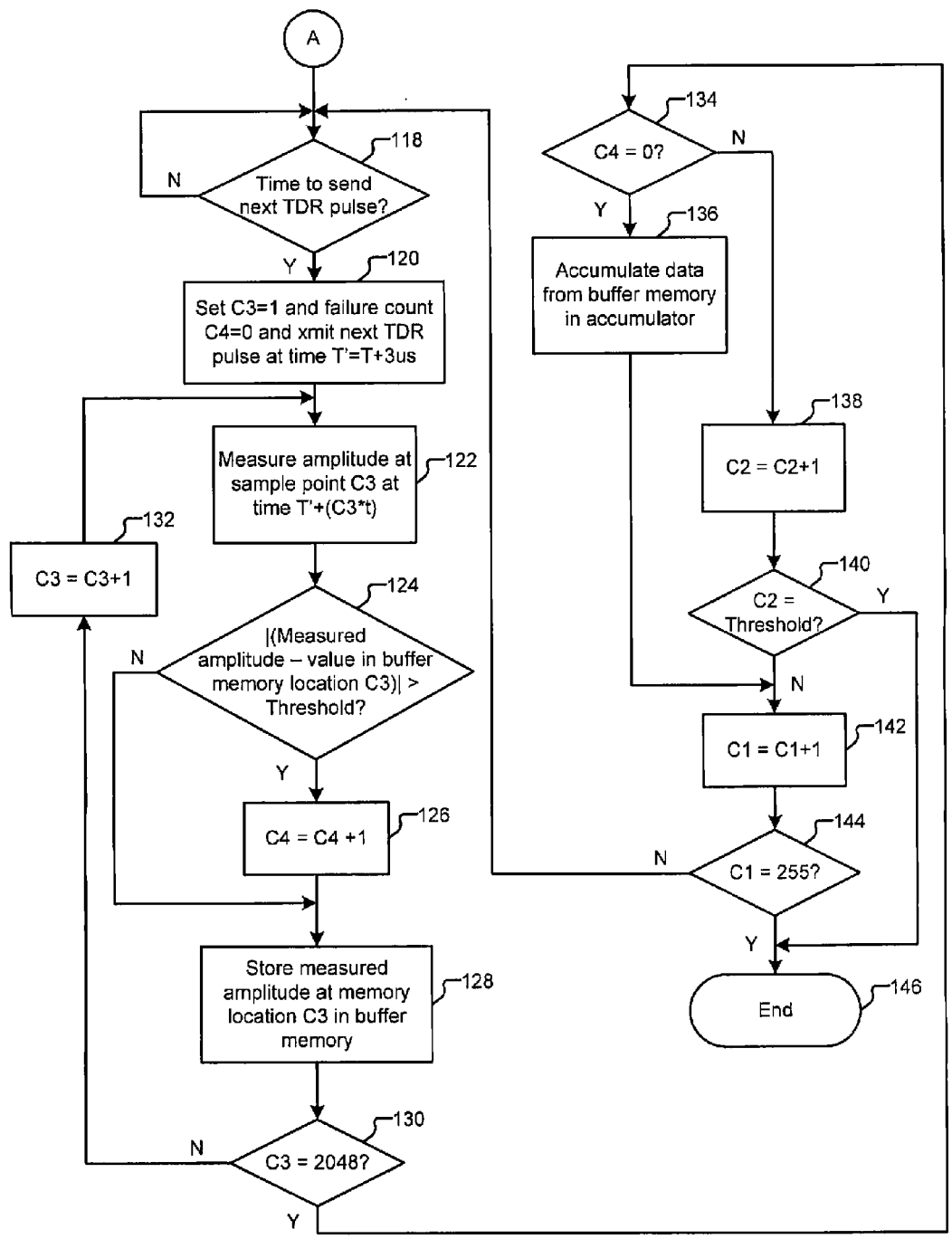

Referring now to FIGS. 6A and 6B, a method 100 for generating and capturing samples of amplitude data on the first pair of the cable 14 is shown. The control module 60 may repeat the method 100 for each pair. The method 100 begins at step 102. The control module 60 initializes the accumulator 70-1 and sets the sample count C1=1 and the bad sample count C2=0 in step 104. The transmitter 72-1 transmits the first test pulse 17 at time T on the first wire of the first pair in step 106. The control module 60 sets the sample point count C3=1 in step 108.

The ADC module 66-1 generates the first amplitude measurement at time T+t (e.g., at sample point count C3=1) in step 110 based on the input present on the second wire of the first pair. The buffer 68-1 stores the first amplitude measurement in the first memory location in step 112. The control module 60 determines in step 114 if the amplitude is measured at the last sample point (e.g., at sample point count C3=2048). If the result of step 114 is false, the control module 60 increments sample point count C3 (e.g., the clock generator module 64 generates the next clock pulse at time (T+(C3)*t)) in step 116, and the method 100 repeats steps 110 through 114.

If the result of step 114 is true (e.g., if the first sample of 2048 amplitude measurements is complete), the control module 60 determines if time to transmit the next test pulse 17 has arrived (e.g., if approximately 3 us elapsed after transmitting the first test pulse 17) in step 118. If the result of step 118 is false, the method 100 repeats step 118. If the result of step 118 is true, the control module 60 sets sample point count C3=1 and failure count C4=0, and the pulse generator module 62 transmits the next test pulse 17 at time T' in step 120, where T'=T+3 us. The ADC module 66-1 generates the first amplitude measurement at time T'+t (e.g., at sample point count C3=1) in step 122 based on the input present on the second wire of the first pair.

The control module 60 determines in step 124 if the first amplitude differs from the first amplitude stored in the first memory location in the buffer 68-1 by at least the predetermined threshold. If the result of step 124 is true, the control module 60 increments failure count C4 in step 126. Thereafter, or if the result of step 124 is false, the buffer 68-1 stores the first amplitude measurement (e.g., writes over the previous first amplitude measurement) in the first memory location in step 128. The control module 60 determines in step 130 if the amplitude is measured at the last sample point (e.g., at sample point count C3=2048). If the result of step 130 is false, the control module 60 increments sample point count C3 (e.g., the clock generator module 64 generates the next clock pulse at time (T'+(C3)*t)) in step 132, and the method 100 repeats steps 122 through 130.

If the result of step 130 is true (e.g., if the second sample is complete), the control module 60 determines in step 134 if any failures due to noise occurred in the second sample (e.g., if the failure count C4 for the second sample is zero or not). If the result of step 134 is true, the control module 60 transfers the data stored in the buffer 68-1 from the second sample to the accumulator 70-1. If the result of step 134 is false, the control module 60 determines that the second sample is bad and increments the bad sample count C2 in step 138. The control module 60 determines in step 140 if the bad sample count C2 is greater than or equal to the bad sample threshold (i.e., the bad sample limit). If the result of step 140 is true, the method 100 ends in step 146.

If the result of step 140 is false or after step 136, the control module 60 increments sample count C1 in step 142. The control module 60 determines in step 144 if C1 is equal to 255 (i.e., if 256 samples are taken by sending 256 test pulses 17). If the result of step 144 is false, the method 100 repeats steps 118 through 144. If the result of step 144 is true, the method 100 ends in step 146.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A physical layer device, comprising:
   a first transmitter configured to transmit a first pulse on a first conductor of a first pair of conductors of a cable;
   a first analog-to-digital converter module configured to generate a first set of outputs, in response to the transmission of the first pulse, by sampling an input from a second conductor of the first pair a plurality of times at a predetermined time interval; and
   a control module configured to determine a first distance from the physical layer device to (i) an open-circuit, (ii) a short-circuit, or (iii) a termination of the first pair based on the first set of outputs.

2. The physical layer device of claim 1, further comprising:
   a clock generator module configured to generate a clock having a period equal to the predetermined time interval, wherein the first analog-to-digital converter module is configured to generate the first set of outputs based on the clock.

3. The physical layer device of claim 1, wherein:
the first transmitter is configured to transmit a second pulse on the first conductor after the first set of outputs is generated; and
the first analog-to-digital converter module is configured to generate a second set of outputs, in response to the transmission of the second pulse, by sampling the input from the second conductor of the first pair a plurality of times at the predetermined time interval.

4. The physical layer device of claim 3, wherein the control module is configured to:
compare the first set of outputs to the second set of outputs,
generate differences between the first set of outputs and the second set of outputs, and
determine if any of the differences is greater than or equal to a predetermined threshold.

5. The physical layer device of claim 4, wherein the control module is configured to determine the first distance from the physical layer device to a point where the first pair is (i) open, (ii) short-circuited, or (iii) terminated based on the second set of outputs if none of the differences is greater than or equal to the predetermined threshold.

6. The physical layer device of claim 3, further comprising:
a second transmitter configured to transmit a third pulse on a first conductor of a second pair of conductors of the cable after the second set of outputs is generated; and
a second analog-to-digital converter module configured to generate a third set of outputs, in response to the transmission of the third pulse, by sampling an input from a second conductor of the second pair a plurality of times at the predetermined time interval,
wherein the control module is configured to determine a second distance from the physical layer device to (i) an open-circuit, (ii) a short-circuit, or (iii) a termination of the second pair based on the third set of outputs.

7. The physical layer device of claim 6, wherein:
the second transmitter is configured to transmit a fourth pulse on the first conductor of the second pair after the third set of outputs is generated; and
the second analog-to-digital converter module is configured to generate a fourth set of outputs, in response to the transmission of the fourth pulse, by sampling the input from the second conductor of the second pair a plurality of times at the predetermined time interval.

8. The physical layer device of claim 7, wherein the control module is configured to:
compare the third set of outputs to the fourth set of outputs,
generate differences between the third set of outputs and the fourth set of outputs, and
determine if any of the differences is greater than or equal to a predetermined threshold.

9. The physical layer device of claim 8, wherein the control module is configured to determine the second distance from the physical layer device to a point where the second pair is (i) open, (ii) short-circuited, or (iii) terminated based on the fourth set of outputs if none of the differences is greater than or equal to the predetermined threshold.

10. The physical layer device of claim 9, wherein the control module is configured to determine at least one of (i) a length of the cable and (ii) whether the cable is faulty based on the first distance and the second distance.

11. A method for a physical layer device, the method comprising:
transmitting a first pulse on a first conductor of a first pair of conductors of a cable;
generating a first set of outputs, in response to the transmission of the first pulse, by sampling an input from a second conductor of the first pair a plurality of times at a predetermined time interval; and
determining a first distance from the physical layer device to (i) an open-circuit, (ii) a short-circuit, or (iii) a termination of the first pair based on the first set of outputs.

12. The method of claim 11, further comprising:
generating a clock having a period equal to the predetermined time interval; and
generating the first set of outputs based on the clock.

13. The method of claim 11, further comprising:
transmitting a second pulse on the first conductor after the first set of outputs is generated; and
generating a second set of outputs, in response to the transmission of the second pulse, by sampling the input from the second conductor of the first pair a plurality of times at the predetermined time interval.

14. The method of claim 13, further comprising:
comparing the first set of outputs to the second set of outputs;
generating differences between the first set of outputs and the second set of outputs; and
determining if any of the differences is greater than or equal to a predetermined threshold.

15. The method of claim 14, further comprising determining the first distance from the physical layer device to a point where the first pair is (i) open, (ii) short-circuited, or (iii) terminated based on the second set of outputs if none of the differences is greater than or equal to the predetermined threshold.

16. The method of claim 13, further comprising:
transmitting a third pulse on a first conductor of a second pair of conductors of the cable after the second set of outputs is generated;
generating a third set of outputs, in response to the transmission of the third pulse, by sampling an input from a second conductor of the second pair a plurality of times at the predetermined time interval; and
determining a second distance from the physical layer device to (i) an open-circuit, (ii) a short-circuit, or (iii) a termination of the second pair based on the third set of outputs.

17. The method of claim 16, further comprising:
transmitting a fourth pulse on the first conductor of the second pair after the third set of outputs is generated; and
generating a fourth set of outputs, in response to the transmission of the fourth pulse, by sampling the input from the second conductor of the second pair a plurality of times at the predetermined time interval.

18. The method of claim 17, further comprising:
comparing the third set of outputs to the fourth set of outputs;
generating differences between the third set of outputs and the fourth set of outputs; and
determining if any of the differences is greater than or equal to a predetermined threshold.

19. The method of claim 18, further comprising determining the second distance from the physical layer device to a point where the second pair is (i) open, (ii) short-circuited, or (iii) terminated based on the fourth set of outputs if none of the differences is greater than or equal to the predetermined threshold.

20. The method of claim 19, further comprising determining at least one of (i) a length of the cable and (ii) whether the cable is faulty based on the first distance and the second distance.

* * * * *